(12) United States Patent
Kiel

(10) Patent No.: US 10,912,191 B2
(45) Date of Patent: Feb. 2, 2021

(54) ELECTRONIC CARD WITH PRINTED CIRCUIT COMPRISING AN INTEGRATED DIFFRACTION STRUCTURE AND METHOD FOR THE PRODUCTION THEREOF

(71) Applicant: INSTITUT VEDECOM, Versailles (FR)

(72) Inventor: Friedbald Kiel, Fontainebleau (FR)

(73) Assignee: INSTITUT VEDECOM, Versailles (FR)

( * ) Notice: Subject to any disclaimer, the term of this patent is extended or adjusted under 35 U.S.C. 154(b) by 2 days.

(21) Appl. No.: 16/480,303

(22) PCT Filed: Jan. 30, 2018

(86) PCT No.: PCT/FR2018/050202
§ 371 (c)(1),
(2) Date: Jul. 23, 2019

(87) PCT Pub. No.: WO2018/142055
PCT Pub. Date: Aug. 9, 2018

(65) Prior Publication Data
US 2019/0373720 A1    Dec. 5, 2019

(30) Foreign Application Priority Data
Feb. 1, 2017   (FR) ...................... 17 50852

(51) Int. Cl.
*H05K 1/02* (2006.01)
*G02B 5/18* (2006.01)
*H05K 1/18* (2006.01)

(52) U.S. Cl.
CPC ............. *H05K 1/0274* (2013.01); *G02B 5/18* (2013.01); *H05K 1/0203* (2013.01); *H05K 1/183* (2013.01); *H05K 2201/10121* (2013.01)

(58) Field of Classification Search
None
See application file for complete search history.

(56) References Cited

U.S. PATENT DOCUMENTS 5,041,849 A      8/1991   Quate et al.
6,007,183 A *   12/1999   Horine .................... B22F 3/115
                                                                    347/46

(Continued)

FOREIGN PATENT DOCUMENTS

DE    102014013563 A1   3/2016
EP        2688115 A1    1/2014

(Continued)

OTHER PUBLICATIONS

International Search Report for PCT/FR2018/050202 dated Apr. 24, 2018.
Written Opinion for PCT/FR2018/050202 dated Apr. 24, 2018.

*Primary Examiner* — Xanthia C Cunningham
(74) *Attorney, Agent, or Firm* — Sandberg Phoenix & von Gontard, P C.

(57) ABSTRACT

The electronic card with printed circuit comprises at least one diffraction structure (DS) having a cavity (15) and a diffraction plate (17). In accordance with the invention, the diffraction structure is incorporated in the thickness of the electronic card with printed circuit, the cavity being formed, by removal of material, in the thickness of the electronic card with printed circuit and the diffraction plate being formed in a plate which is arranged on the electronic card with printed circuit and closes the cavity.

14 Claims, 4 Drawing Sheets

(56) References Cited

U.S. PATENT DOCUMENTS

| | | | |
|---|---|---|---|
| 6,302,524 B1* | 10/2001 | Roy | B41J 2/14008 |
| | | | 347/46 |
| 6,925,856 B1* | 8/2005 | Williams | G01N 11/16 |
| | | | 73/54.41 |
| 7,719,170 B1 | 5/2010 | Kim et al. | |
| 9,184,414 B2* | 11/2015 | Naraoka | C09B 3/02 |
| 9,373,818 B2* | 6/2016 | Tobise | H01L 51/5268 |
| 9,485,878 B2* | 11/2016 | Lee | H05K 1/185 |
| 2007/0053628 A1 | 3/2007 | Park et al. | |
| 2009/0170038 A1* | 7/2009 | Amako | G03F 7/001 |
| | | | 430/321 |
| 2011/0216255 A1* | 9/2011 | Miyauchi | G02F 1/133 |
| | | | 349/19 |
| 2017/0028762 A1* | 2/2017 | Ide | B42D 25/40 |
| 2018/0304586 A1* | 10/2018 | Ichikawa | B42D 25/45 |
| 2019/0025480 A1* | 1/2019 | Kuo | G02B 5/0278 |

FOREIGN PATENT DOCUMENTS

| | | |
|---|---|---|
| WO | 2009115946 A1 | 9/2009 |
| WO | 2010122458 A1 | 10/2010 |
| WO | 2016156670 A1 | 10/2016 |

* cited by examiner

ELECTRONIC CARD WITH PRINTED CIRCUIT COMPRISING AN INTEGRATED DIFFRACTION STRUCTURE AND METHOD FOR THE PRODUCTION THEREOF

CROSS-REFERENCE TO RELATED APPLICATIONS

This application is the US National Stage under 35 USC § 371 of International Application No. PCT/FR2018/050202, filed 30 Jan. 2018 which claims priority to French application 1750852 filed 1 Feb. 2017 the content (text, drawings and claims) of both being included herein by reference.

BACKGROUND

The invention generally relates to the field of electronic printed circuit boards. More specifically, the invention relates to an electronic printed circuit board comprising an integrated diffraction structure. The invention also relates to a method for production of such an electronic printed circuit board.

The progress achieved over recent decades in the technology for microelectronics and for miniaturization has led to the emergence of new generations of components for emitting and receiving waves and for transducers in the microwave, optical and acoustic fields. Miniaturization and cost reduction of these components lead to widespread adoption thereof.

These new generation emitter/receiver components find multiple applications, for example, in the fields of ground, air and sea transportation, instrumentation, environment, domestic robotics, household appliances, health, automation, industrial process control and safety.

Further, integration of these emitter/receiver components in consumer devices is growing significantly. One example of this trend is the widespread incorporation of CCD or CMOS image sensors and GPS receivers in mobile phones in addition to audio transducers; this trend should grow in the coming years with the development of connected objects.

Diffraction structures and networks are frequently necessary in emitter/receiver components, for example, for modification of the path of the waves or for filtering them. Thus, for example, in an image sensor, a diffraction structure is often provided in the optical device of the sensor.

The inventor is aware of an image sensor implanted in an electronic printed circuit board, comprising a CCD chip mounted on the surface of the board, and an applied optical device which covers the CCD chip and is attached onto the board.

This prior art technique has the disadvantage of high cost of the applied optical device, in terms of production cost of the device itself and the cost of placement of the device on the board. Further, the positioning of the applied optical device relative to the CCD chip requires a high precision which constitutes a notable impediment to an increased miniaturization of the sensor.

The production of a Fresnel lens in an acoustic transducer by using photolithographic and etching techniques is known from U.S. Pat. Nos. 7,719,170B1 and 5,041,849A.

The expected expansion of the market for components for emitting and receiving waves and for transducers calls for a technological advance in the implementation of diffraction structures and networks suited for miniaturization and which can be integrated into electronic printed circuit boards with reduced dimensions and costs.

SUMMARY

According to a first aspect, an electronic printed circuit board is disclosed comprising at least one diffraction structure having a cavity and a diffraction plate. The diffraction structure is integrated in the thickness of the electronic printed circuit board, where the cavity is formed in the thickness of the electronic printed circuit board by removal of material, and the diffraction plate is formed in a plate which is applied onto the electronic printed circuit board and closes said cavity.

In that way a emitter or receiver device equipped with a diffraction structure can be implemented in an electronic printed circuit board at very low cost and with a minimal dimensions. Also, the dimensional definition of the diffraction structure is easily met because of the high precision achievable with printed circuit production techniques.

The implementation of electronic boards of the type called SIP ("System in Package") is thus easier.

According to a specific characteristic, the diffraction plate is formed from a dielectric plate, a copper plate, a CCL-type plate and/or an RCC-type plate.

According to a specific embodiment, the diffraction plate is formed from a dielectric plate and comprises a diffraction pattern implemented with indentation and/or selective metal depositing and photolithographic etching techniques. Thus, the diffraction plate is made in the form of a Fresnel lens, sinusoidal zone plate, a phase-shift zone plate or a hologram.

According to another specific embodiment, the diffraction plate comprises a diffraction pattern with openings, where the diffraction pattern is made with material cutting and removal techniques comprising mechanical or laser milling/drilling.

According to another specific embodiment, the diffraction plate is formed from a b-stage material and comprises a diffraction pattern with openings, where the diffraction pattern is made with an indentation technique to form the openings.

According to another specific embodiment, the cavity is filled with air or a material modifying the speed of acoustic or optical waves.

According to another specific embodiment, the cavity comprises a coating layer on the walls.

According to yet another specific embodiment, the electronic printed circuit board comprises several diffraction structures, where the diffraction structures are combined and form a network.

According to another specific embodiment, the electronic printed circuit board is a multilayer type.

In a specific application of the diffraction structure to an emitter device, the electronic printed circuit board comprises an electronic emitter component implanted at the bottom of the cavity of the diffraction structure. According to a specific characteristic, the electronic printed circuit board also comprises a conductor which is in contact with the electronic emitter component and has a function of extracting heat produced by the electronic emitter component.

In a specific application of the diffraction structure to a receiver device, the electronic printed circuit board comprises a electronic receiver component implanted at the bottom of the cavity of the diffraction structure.

It will be noted that the diffraction structure allows implementation of various types of sensors, detectors, emitters and receivers in the microwave, optical and acoustic domains. Thus, it is possible to conceive of CCD or CMOS type image sensors, ultrasound transducers, and, more generally, emitting and receiving devices with LED or laser diodes, in the far infrared, photodiodes or phototransistors and others, and to do so in a way integrated in the electronic printed circuit boards with the associated diffraction structures thereof.

According to another aspect, a method for production of an electronic printed circuit board is disclosed where the electronic printed circuit board comprises at least one diffraction structure comprising a cavity which is formed in the thickness of the electronic printed circuit board and a diffraction plate formed in a plate which is applied onto the electronic printed circuit board and closes the cavity, where the method comprises steps of photolithography and etching. The method also comprises a step of removal of material for forming the cavity and a step of lamination of several printed circuit plates in order to form the electronic printed circuit board.

DESCRIPTION OF THE FIGURES

Other advantages and characteristics of the claimed invention will appear more clearly upon reading the following detailed description of several specific embodiments of the claimed invention, with reference to the attached drawings, in which:

DETAILED DESCRIPTION

Generally, well understood multilayer electronic printed circuit board production materials and techniques are used for the implementation of an electronic printed circuit board with one or more integrated diffraction structures.

Thus, it will be possible to use: copper-clad laminate (CCL) plates, with loaded or not fiberglass, dielectrics preimpregnated with epoxy type resin, called "prepregs", whether completely or partially polymerized (b-stage prepregs), thin sheets or plates of copper with a resin coating, RCC (Resin Coated Copper) type, and adhesives.

Electronic printed circuit board production techniques, such as lamination, photolithography, wet etching, and electrodeposition can be used. Material cutting and removal techniques, such as mechanical or laser milling and drilling, can also be used, as can indentation techniques for forming hollow imprints in the diffraction plates or making openings and notches.

Figure 1:
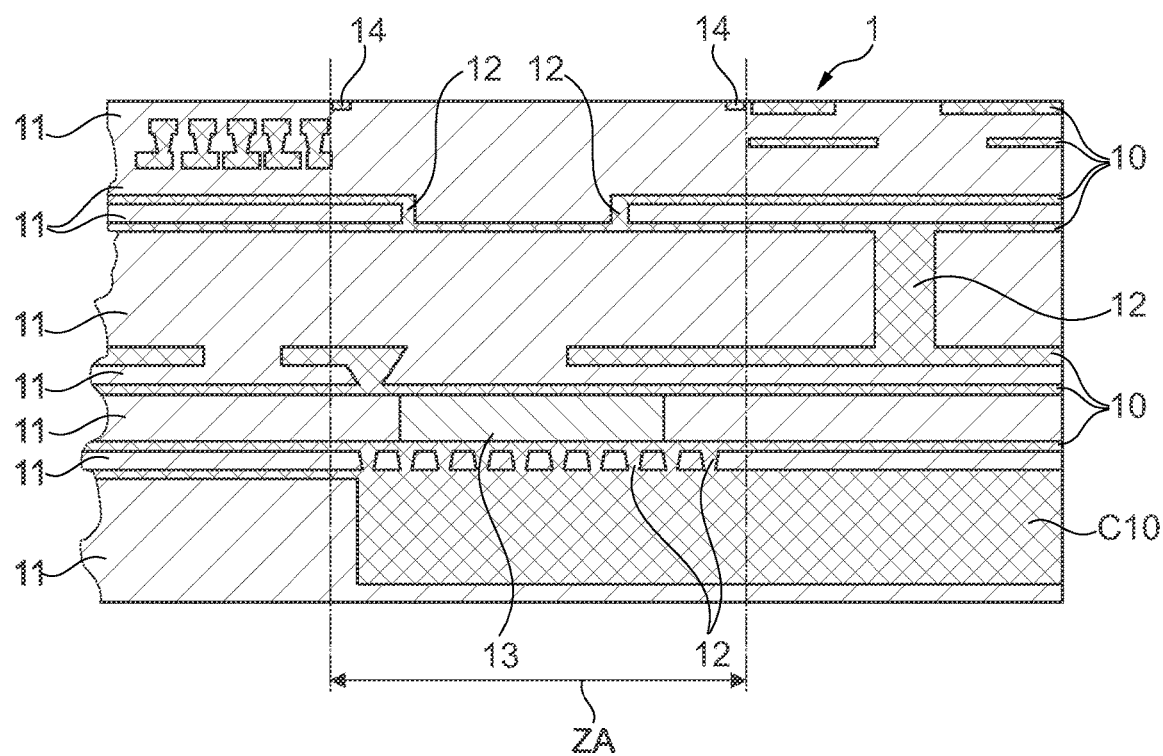
FIG. 1 is a partial section view of an electronic printed circuit board in a state which precedes integration of a diffraction structure.
Figure 2:
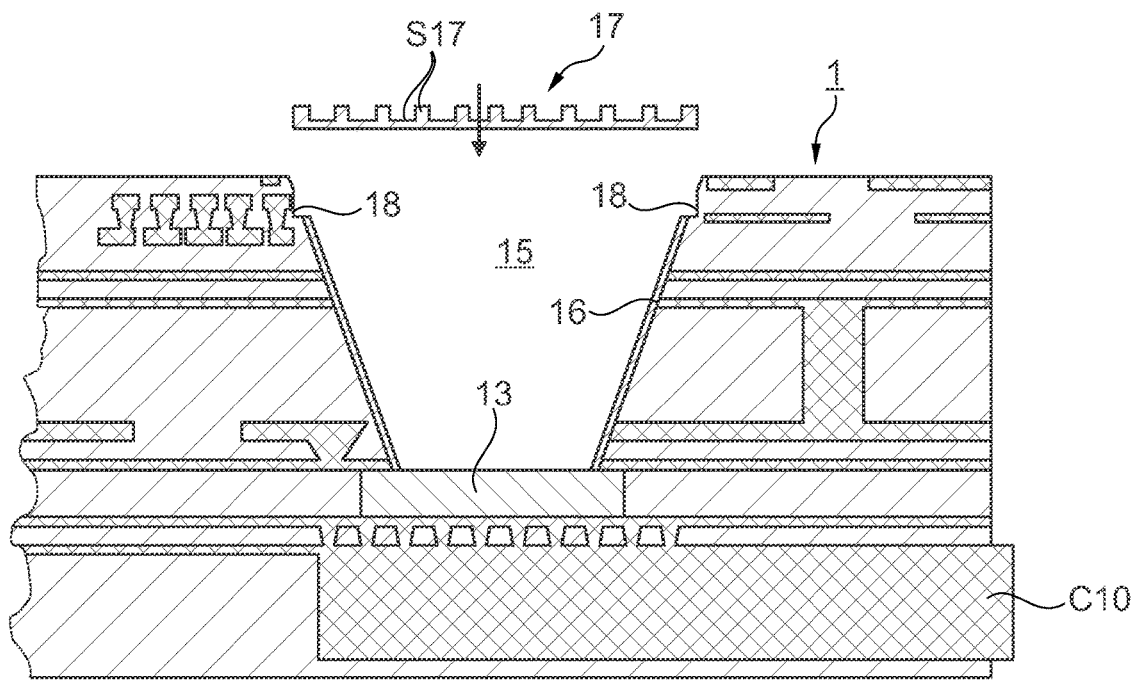
FIG. 2 is a partial section view of the electronic printed circuit board from FIG. 1 in which a cavity was formed for the diffraction structure.
Figure 3:
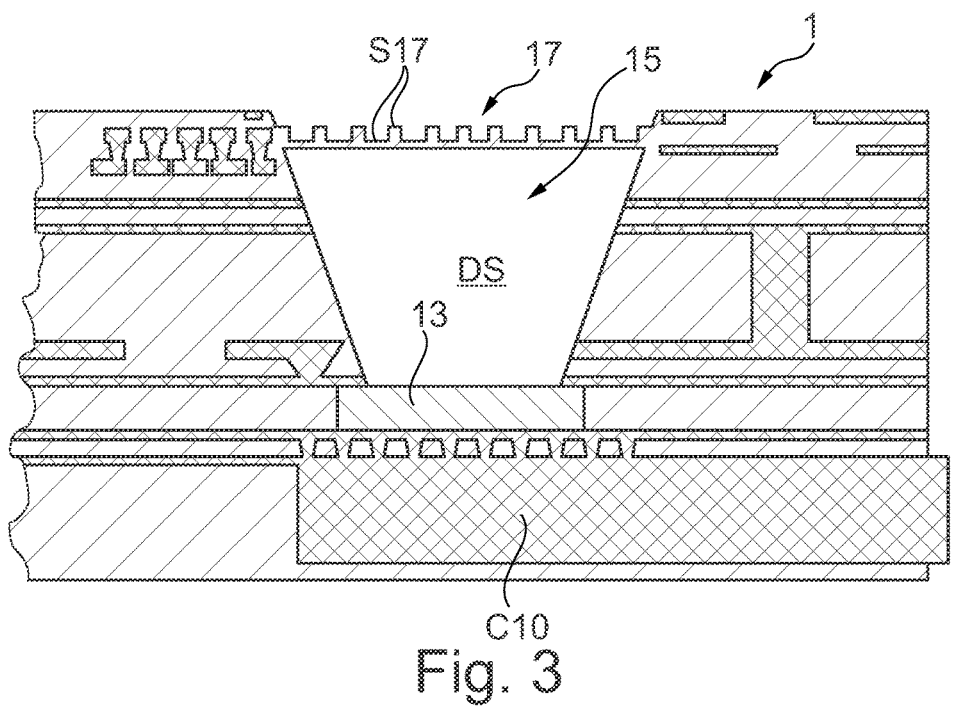
FIG. 3 is a partial section view of the electronic printed circuit board from FIG. 1 in which the diffraction structure is integrated.

Referring to FIGS. 1, 2 and 3, the steps for production of an electronic printed circuit board with an integrated diffraction structure, by implementation of the method, are described below.

FIG. 1 shows a multilayer electronic printed circuit board 1 in which a diffraction structure will be integrated.

As shown in FIG. 1, the electronic printed circuit board 1 is conventionally formed from a plurality of copper conducting layers 10 and dielectric layers 11. Conducting patterns for connection are made in the conducting layers 10, and also through holes 12 for interconnection of conducting patterns located in the various layers. Active and passive electronic components of the circuit, such as the electronic component 13, are buried between internal layers of the board 1 during implementation thereof.

The area ZA, shown in FIG. 1, is the area of the board 1 in which the diffraction structure will be implanted. An electronic component 13 is implanted in this area which, in this implementation example, is an LED emitting in the infrared (IR) spectrum. The objective here is to implement an IR emitter by combining the LED 13 with a diffraction structure. Obviously, the implementation of an IR receiving device in the board 1 will be done similarly, for example with a phototransistor chip sensitive to infrared radiation.

As shown in FIG. 1, the IR diode 13 is buried between internal layers 10, 11 of the board 1. The IR diode 13 comprises electrodes, not visible in FIG. 1, which are soldered to the copper connection pattern of the board 1.

As shown in FIG. 1, a conductor C10 comprised here of a thick copper layer may be provided for cooling the IR diode 13. The function of this conductor C10 is to extract heat produced by the IR diode 13 to a thermal dissipater (not shown). Through-holes 12 are made here to connect a metal surface of the diode 13 to the conductor C10. The conductor C10 may or may not be necessary depending on the power of the IR emitter. When the conductor C10 is needed, it will be sized according to the heating power to be evacuated. The conductor C10 will be necessary more rarely in the case of an IR receiver.

A cavity 15, shown in FIG. 2, is formed in the thickness of the board 1. In this embodiment, an indexing pattern, labeled 14 in FIG. 1, was made on the upper surface of the board 1 so as to allow indexing of the material removal tool which is used to clear the cavity 15.

As shown in FIG. 2, the material is removed above the IR diode 13 in order to clear the desired volume for the cavity 15. This material is typically removed with a milling cutter, by laser and/or by chemical photoetching techniques allowing a precise cutting of the metal layers.

The dimensions and shape of the cavity 15 are conventionally determined in consideration of the wavelength of the IR radiation. The depth of the cavity is determined so as to obtain the desired focal distance between the emitting surface of the component 13 and a diffraction plate 17 which is shown in place in FIG. 3.

As shown in FIG. 2, the walls of the cavity 15 may then be covered with a reflective coating layer 16. Of course, the nature of this reflective coating will depend on the type of device and could prove necessary or not depending on the wavelength and the preferred yield. Thus, in the case of infrared radiation, a thin layer of a gold alloy or of other infrared reflecting material may be deposited in some applications, for example by electrolytic deposition in the case of a metallic layer.

The implementation of the structure is completed by the placement of the diffraction plate 17 intended to close the upper part of the cavity 15. Here, the diffraction plate 17 takes the form of a Fresnel dielectric lens.

The plate 17 is obtained here from a dielectric cover plate, for example of epoxy resin, in which a diffraction pattern S17 is made, visible in FIG. 2, forming a Fresnel lens. The diffraction pattern S17 here has the shape of a hollow imprint made, for example, with an indentation technique.

A shoulder 18 is provided above the walls the cavity 15. The shoulder 18 provides a precise positioning of the plate 17 in the opening of the cavity 15. A precise positioning is necessary for complying with the dimensional definition of the diffraction structure. The plate 17 is attached by adhering into the opening of the cavity 15.

It will be noted that according to the application, the cavity 15 will be filled with air or a material modifying the speed of the acoustic or optical waves.

The diffraction structure DS, comprising the diffraction plate 17 and the underlying cavity 15, is shown in the finished state thereof in FIG. 3. As shown in FIG. 3, the diffraction structure DS is completely integrated in the electronic printed circuit board 1.

Figure 4:
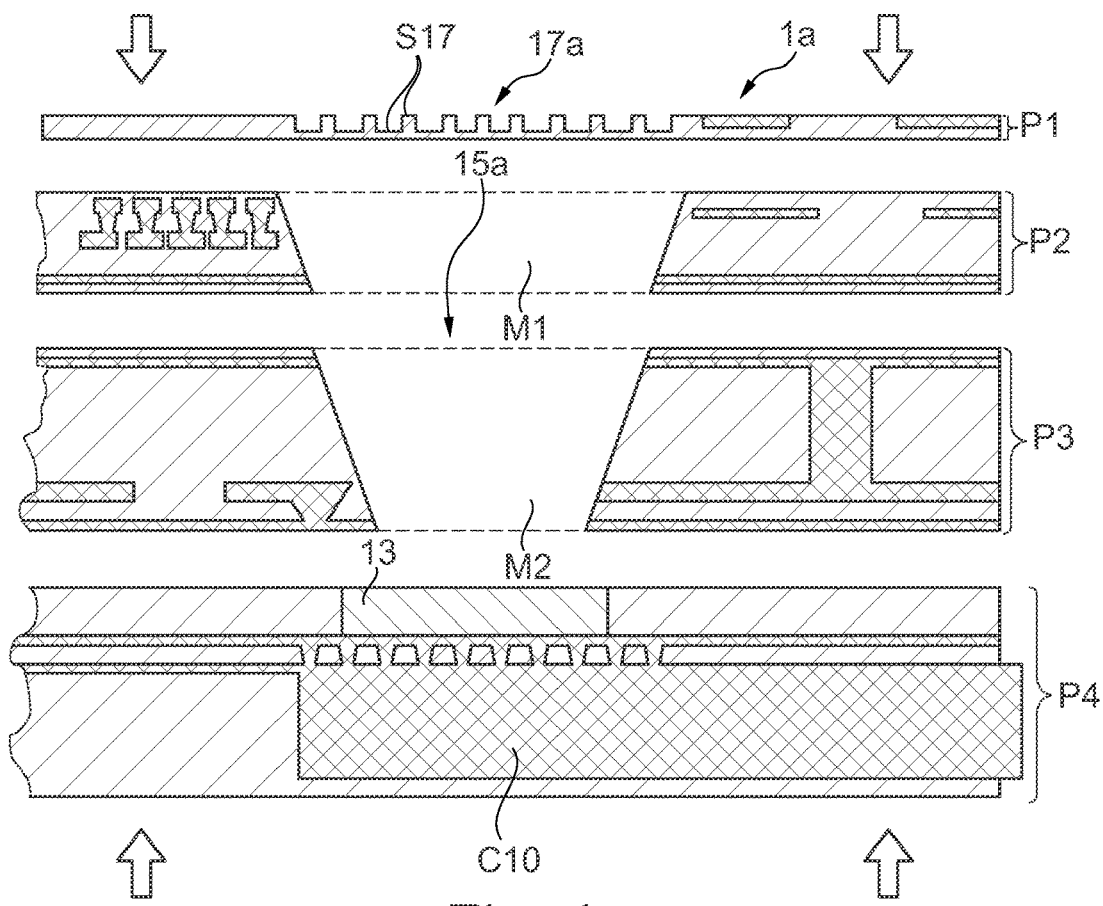
FIG. 4 is a partial section view of several printed circuit plates before lamination thereof to form the printed circuit board with the cavity for the diffraction structure.

As shown in FIG. 4, an electronic printed circuit board 1a with the diffraction structure 15a, 17a thereof integrated according to the invention, may also be formed by lamination of several printed circuit plates. In the embodiment from FIG. 4, there are four printed circuit plates, specifically P1 to P4.

Each of the plates P1 to P4 is formed with techniques for production of electronic printed circuit boards.

Material M1, M2 is removed here from the plates P2 and P3 so as to clear a total volume corresponding to the intended volume for the cavity 15a. Material M1, M2 is removed analogously to what was done for the cavity 15, meaning, typically with milling cutter, laser and/or chemical photoetching techniques.

The plate P1 incorporates a diffraction area 17a. The area 17a comprises a diffraction pattern S17 forming a dielectric Fresnel lens.

The plates P1 to P4 are then laminated by pressing and passing through a lamination oven under vacuum, after having been coated, on the lamination surfaces thereof, with, for example, an epoxy-type polymerizable resin for assuring their adhesion. The result is the electronic multilayer printed circuit board 1a with the diffraction structure 15a, 17a.

In the case where a reflecting coating layer, such as the layer 16 shown in FIG. 2, must be deposited and/or when a filling of the cavity 15a with a material changing the speed is required, lamination of the plates P1 to P4 can be done in two steps.

The lamination of plates P2 to P3 will be done first to form the cavity 15a. Once the cavity 15a is formed, the step of depositing the coating layer and/or the step of filling the cavity 15a can be done. The lamination of the plate P1 which closes the cavity 15a finishes the implementation of the board 1a.

Figure 5:
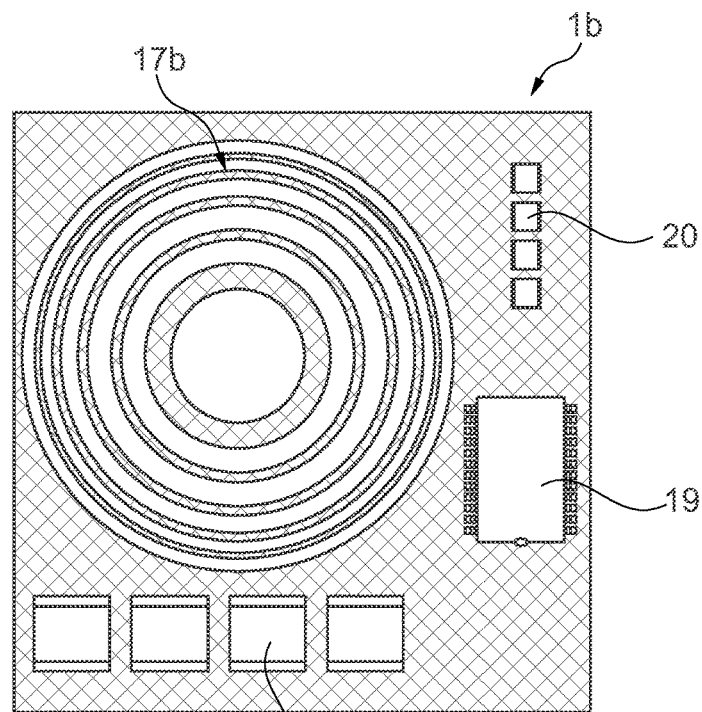
FIG. 5 is a top view of an electronic printed circuit board comprising a diffraction structure.

FIG. 5 shows, in top view, an electronic printed circuit board 1b comprising a diffraction structure analogous to those from boards 1 and 1a. A Fresnel dielectric lens 17b covers an underlying cavity that is not visible. An integrated circuit 19 and various electronic components 20, 21 of the electronic circuit for the emitter or receiver device are here mounted on the surface of the board 1b.

Of course, the diffraction plates that can be incorporated in the diffraction structures can have various functions, shapes and dimensions depending on the application and the type of the device. Thus, the diffraction plates may have a function of focusing, concentrating or dispersing the waves.

In the present invention, the diffraction plates may take the shape of surface diffraction networks with equidistant, in one or two dimensions, surface diffraction patterns. These diffraction plates may, for example, have the shape of concentric networks, such as a Fresnel lens, or the shape of centered square networks.

The use of indentation techniques for creating hollow imprints, for example, in pre-impregnated, covering dielectric layers or solder mask dielectric layers, and of selective metal depositing techniques and photolithographic etching allow implementation of diffraction plates in the form of Fresnel lenses, sinusoidal zone plates, phase-shift zone plates or holograms. Nanometric control of photolithographic and etching techniques acquired in the field of microelectronics and components is put to good use for forming fine, high-precision diffraction patterns.

The diffraction plates may, for example, be formed from a CCL plate, a prepreg, a thin copper plate, or an RCC plate.

The diffraction plates for the present invention may also comprise diffraction patterns with openings, in particular for optical and acoustic applications. Thus, material cutting and removal techniques, like mechanical or laser milling and drilling, may also be used to form openings in the patterns of the diffraction plates. Indentation techniques can also be called on to form openings and notches in the patterns, in particular if a b-stage material, such as a prepreg, is used to form the diffraction plate.

Figure 6A:
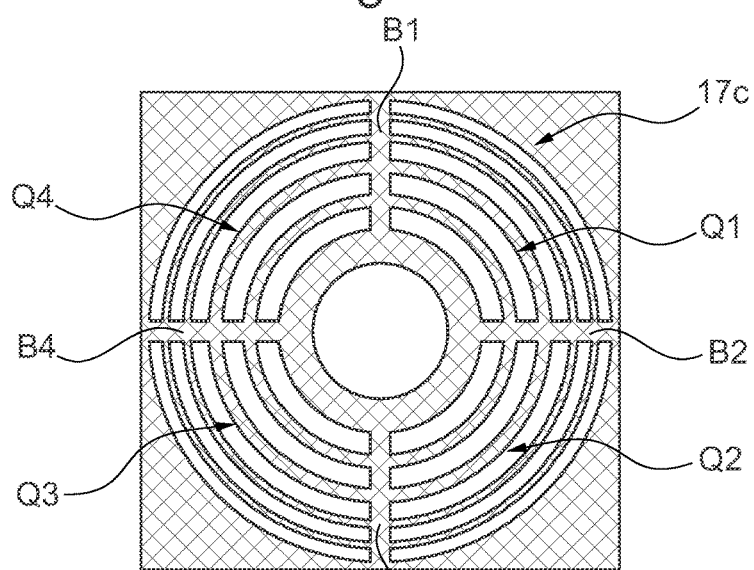
FIGS. 6A and 6B are top and section views of an embodiment with openings in the diffraction plate included in the diffraction structure.
Figure 6B:
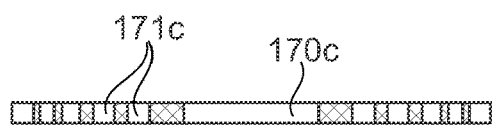

A diffraction plate 17c with openings is shown in FIGS. 6A and 6B.

The plate 17c comprises a concentric diffraction pattern which is divided into four quarters Q1 to Q4. The quarters Q1 to Q4 each comprise a portion of a central opening 170c and concentric openings 171c. Openings 170c and 171c of the diffraction plate 17c appear in the section view from FIG. 6B. Arms B1 to B4, crossed at 90°, mechanically hold the diffraction pattern formed of quarter-circle, alternating openings and rings of material.

Figure 7:
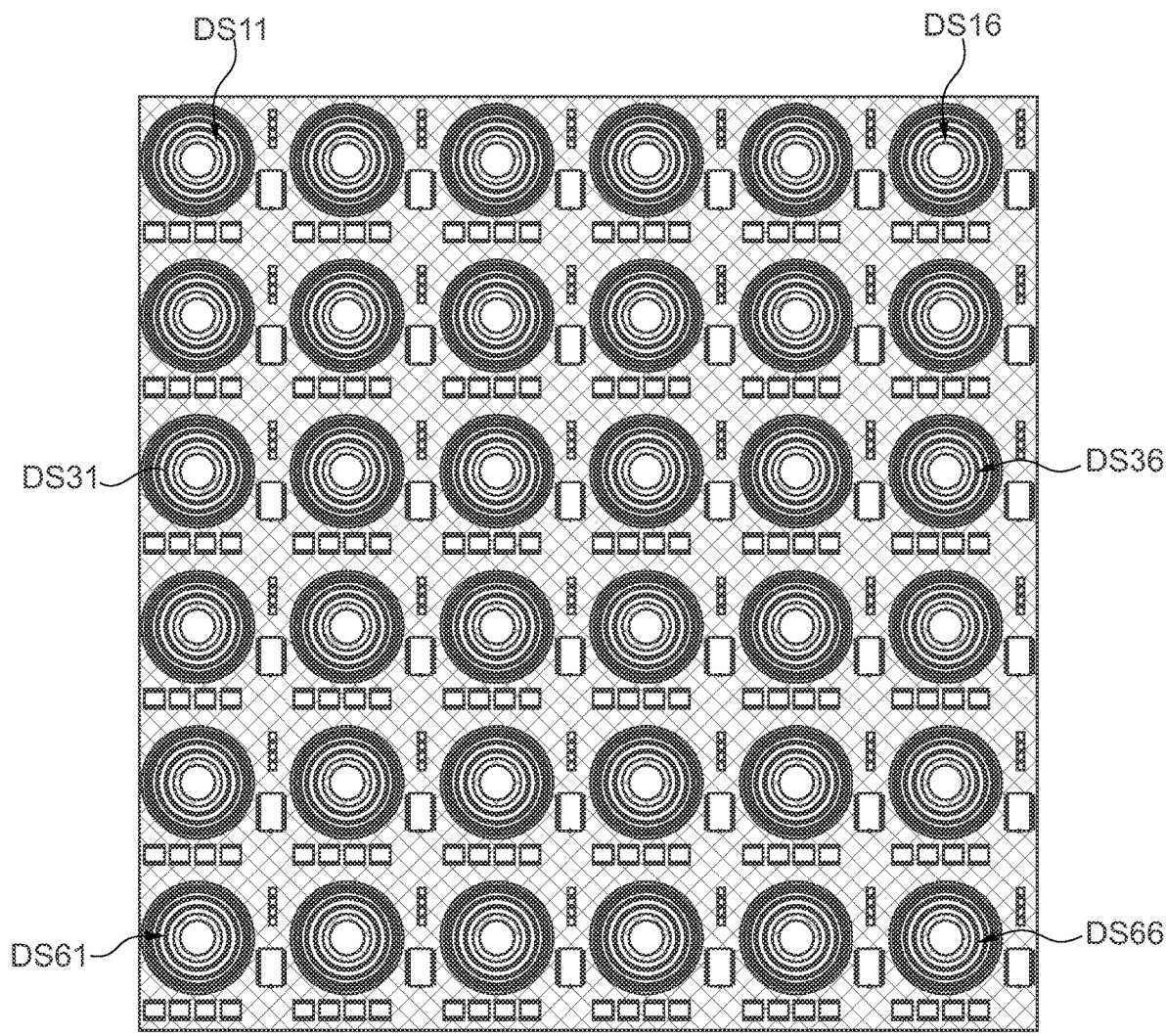
FIG. 7 is a top view of an electronic printed circuit board comprising a plurality of diffraction structures which are arranged to form a network.

As shown in FIG. 7, a plurality of diffraction structures DS may be laid out in a network in a single electronic printed circuit board. Generally, the invention allows the construction of networks with a large number of diffraction structures placed, for example, according to an M×N matrix. In the example from FIG. 7, the diffraction structures DS are arranged according to a square matrix with M=6 lines by N=6 columns.

The invention is not limited to the specific embodiments which have been described here as examples. The person skilled in the art, according to the applications of the invention, may apply various modifications and variants which fall within the scope of the attached claims.

The invention claimed is:

1. An electronic printed circuit board comprising at least one diffraction structure having a cavity and a diffraction plate, wherein said diffraction structure is integrated in the thickness of said electronic printed circuit board, where said cavity is formed in the thickness of said electronic printed circuit board by removal of material, and said diffraction plate is formed in a plate which is applied onto said electronic printed circuit board and which closes said cavity.

2. The electronic printed circuit board according to claim 1, wherein said diffraction plate is formed from a dielectric plate, a copper plate, a CCL-type plate and/or an RCC-type plate.

3. The electronic printed circuit board according to claim 1, wherein said diffraction plate is formed from a dielectric plate and comprises a diffraction pattern implemented with indentation and/or selective metal depositing and photolithographic etching techniques.

4. The electronic printed circuit board according to claim 3, wherein said diffraction plate is made in the form of a Fresnel lens, a sinusoidal zone plate, a phase-shift zone plate or a hologram.

5. The electronic printed circuit board according to claim 2, said diffraction plate comprises a diffraction pattern with openings, where said diffraction pattern is made with material cutting and removal techniques comprising mechanical or laser milling/drilling.

6. The electronic printed circuit board according to claim 2, wherein said diffraction plate is formed from a b-stage material and comprises a diffraction pattern with openings, where said diffraction pattern is made with an indentation technique to form said openings.

7. The electronic printed circuit board according to claim 1, wherein said cavity is filled with air or a material modifying the speed of acoustic or optical waves.

8. The electronic printed circuit board according to claim 1, wherein said cavity comprises a coating layer on a wall of said cavity.

9. The electronic printed circuit board according to claim 1, wherein said electronic printed circuit board comprises a plurality of said diffraction structures, said diffraction structures being combined and form a network.

10. The electronic printed circuit board according to claim 1, wherein said electronic printed circuit board is of multilayer type.

11. The electronic printed circuit board according to claim 1, wherein said electronic printed circuit board comprises an emitter electronic component implanted at the bottom of said cavity of said diffraction structure.

12. The electronic printed circuit board according to claim 11, wherein said electronic printed circuit board comprises a conductor which is in contact with said electronic emitter component in order to extract heat produced by said electronic emitter component.

13. The electronic printed circuit board according to claim 1, wherein said electronic printed circuit board comprises a receiver electronic component implanted at the bottom of said cavity of said diffraction structure.

14. A method for producing an electronic printed circuit board wherein said electronic printed circuit board comprises at least one diffraction structure comprising a cavity which is formed in the thickness of said electronic printed circuit board and a diffraction plate which is applied onto said electronic printed circuit board and closes said cavity, said method comprises photolithography and etching steps, wherein said method also comprises a step of removal of material from said electronic printed circuit board in order to form said cavity and a step of lamination of several printed circuit plates in order to form said electronic printed circuit board.

* * * * *